(12) United States Patent
Heise

(10) Patent No.: US 7,549,093 B2
(45) Date of Patent: Jun. 16, 2009

(54) METHOD FOR CHANGING A DEPTH OF AN INTERLEAVER DEVICE OR DE-INTERLEAVER DEVICE AND CORRESPONDING INTERLEAVER DEVICE AND DE-INTERLEAVER DEVICE

(75) Inventor: Bernd Heise, München (DE)

(73) Assignee: Infineon Technologies AG, Munich (DE)

( * ) Notice: Subject to any disclaimer, the term of this patent is extended or adjusted under 35 U.S.C. 154(b) by 535 days.

(21) Appl. No.: 11/137,103

(22) Filed: May 24, 2005

(65) Prior Publication Data

US 2005/0283706 A1  Dec. 22, 2005

(51) Int. Cl.
*G11C 29/00* (2006.01)
(52) U.S. Cl. ................................. 714/702
(58) Field of Classification Search ........... 714/702
See application file for complete search history.

(56) References Cited

U.S. PATENT DOCUMENTS

| 4,547,887 | A | * | 10/1985 | Mui | ................ | 375/285 |
| 6,014,761 | A | * | 1/2000 | Lachish et al. | ......... | 714/702 |
| 6,421,796 | B1 | * | 7/2002 | Gatherer | ............... | 714/702 |

FOREIGN PATENT DOCUMENTS

| EP | 0 759 665 A1 | 2/1997 |
| EP | 0 856 949 A1 | 8/1998 |
| EP | 1 154 577 A1 | 11/2001 |

* cited by examiner

*Primary Examiner*—Shelley A Chase
(74) *Attorney, Agent, or Firm*—Maginot, Moore & Beck

(57) ABSTRACT

Methods for changing a depth of interleaver devices and de-interleaver devices are provided, whereby a change in the depth is possible while transmitting or receiving operations are in progress. For this, delays of delaying devices are enlarged or reduced, additional data values being inserted to guarantee smooth flowing data transmission.

32 Claims, 3 Drawing Sheets

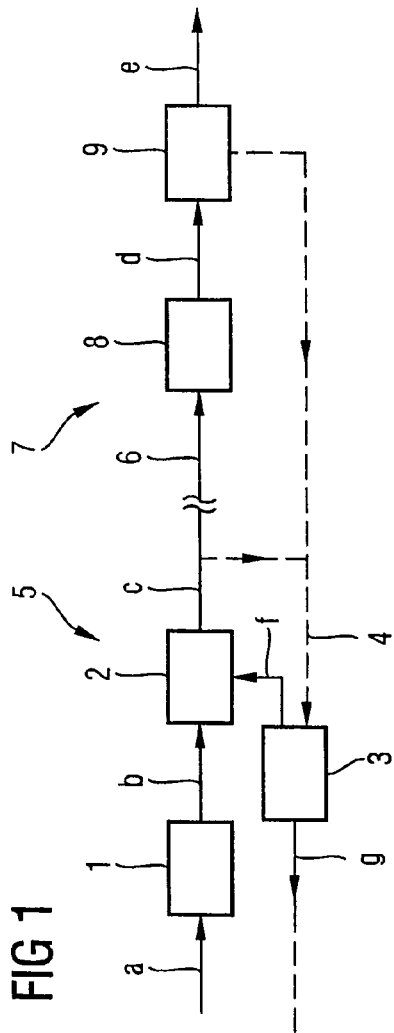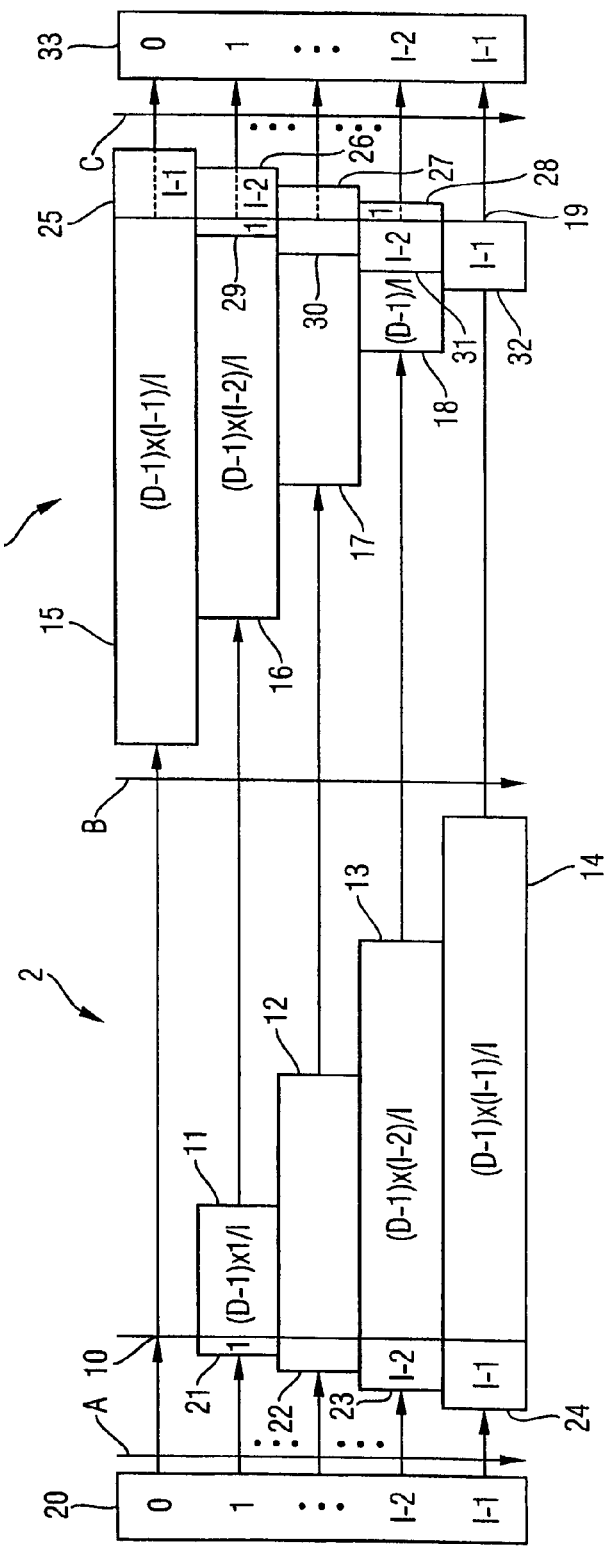

METHOD FOR CHANGING A DEPTH OF AN INTERLEAVER DEVICE OR DE-INTERLEAVER DEVICE AND CORRESPONDING INTERLEAVER DEVICE AND DE-INTERLEAVER DEVICE

FIELD OF THE INVENTION

The present invention relates to methods for changing a depth of an interleaver device and a corresponding de-interleaver device and also a correspondingly configured interleaver device or de-interleaver device. An interleaver device is to be understood as a device for nesting data, i.e. in particular for changing a sequence of data elements of a data stream. The invention can be applied in particular in DSL (Digital Subscriber Line) data transmission systems.

BACKGROUND

In data transmission, for example via two-wire lines which are normally in cable bundles, interferences may occur as a result of electrical couplings of other lines into the same cable bundle or else of other systems, such as, for example, television transmitters, radio transmitters or electrical appliances, which may lead to so-called bit errors. This means that a transmitted bit sequence is changed by the interference.

Various coding methods are used in order to be able to correct errors of this kind. In general in these coding methods redundant data are transmitted, such as, for example, check sums by which bit errors of this kind can be found and also corrected.

In ADSL (Asymmetric Digital Subscriber Line)—and VDSL (Very High Bit Rate Digital Subscriber Line)—systems the so-called Reed Solomon code is used, for example, for coding. The data to be transmitted are here combined into so-called code words with a length of up to 255 bytes, which comprise up to 16 bytes with redundant data, with the aid of which bit errors can be corrected in up to 8 bytes.

However, conditional on the type of data transmission, for example when using so-called trellis coding, or on short interferences of high intensity, bit errors sometimes occur in a short period of time on such a large scale that considerably more than 8 bytes in succession are changed or corrupted and thus correction is no longer possible by means of the coding.

A so-called interleaver is used to solve this problem. The interleaver distributes the transmission of a code word to be transmitted over a fairly long period of time and fills the gaps arising with preceding or following code words. For example, first a byte of a first code word, then a byte of a second code word and then a byte of a third code word are transmitted, before a byte of the first code word is transmitted again. In this way it is achieved that if there is interference only a few bytes of a single code word are affected and thus correction with the aid of the coding continues to be possible.

A transmission system operating on this principle is illustrated schematically in FIG. 4. Here a coder 1 which codes a signal a to be transmitted, for example according to the Reed Solomon coding, is provided on the side of a transmitting device 2. The thus coded signal b is nested by an interleaver device or an interleaver 46. The thus arising signal c is transmitted to a receiver 8 via a transmission line 6. In the receiver 8 a corresponding interleaver 47 undoes the nesting of the data, in order to generate a signal d, substantially corresponding to the coded signal b. This signal d is decoded by a decoder 9, in order to generate a decoded received signal e, corresponding to the signal a to be transmitted.

Naturally, both on the transmitter and the receiver side there is a multiplicity of further elements, such as filters, transmitting amplifiers, analog-to-digital or digital-to-analog converters or modulation devices. However, they are not essential for understanding the present invention and are therefore not illustrated in FIG. 4.

In ADSL or VDSL systems so-called convolutional interleavers are used as interleavers 46. The de-interleaver 47 is then correspondingly configured. The mode of operation of such convolutional interleavers or de-interleavers will be explained in greater detail below.

Interleavers of this kind are designed to nest blocks with a length of I bytes in each case with one another. A block of this kind either corresponds to one code word or each code word is divided into several blocks before nesting.

Each byte in a block is delayed corresponding to its position according to the following formula:

$$V_1 = j \cdot (D-1); j=0,1,2, \ldots I-1 \tag{1}$$

$V_1$ here designates the delay in clock units, one byte being transmitted per clock unit. j designates the position of the respective byte within the block and D designates the so-called depth of the interleaver, which essentially indicates over how many blocks the interlacing is performed.

In the receiver this process is undone again, in that again a delay is performed, this being by $$V_d = (I-1-j) \cdot (D-1); j=0,1,2, \ldots I-1 \tag{2}$$

$V_d$ here designates the delay in the de-interleaver.

Each byte is therefore delayed in total by $V_j + V_d = (I-1) \cdot (D-1)$ clock units, so that after the de-interleaver the original sequence is restored again. Appropriate intermediate storage is needed for this delay. The required memory for this is in each case $(I-1) \cdot (D-1)/2$ bytes both in the interleaver and in the de-interleaver.

In FIG. 5 is an option for implementing an interleaver or de-interleaver of this kind by I delay paths in each case, implemented in the form of so-called FIFO buffers or FIFO memories (First In First Out).

Reference numeral 20 here designates a data block with I bytes, continuously numbered from 0 to I−1 and fed to the interleaver 46. As indicated by an arrow A, the individual bytes of block 20 are fed successively, i.e. clock by clock, to delaying devices 10-14, depending on their position, there being a total of I delaying devices of this kind.

Delaying device 10 to which the byte with the position "0" of block 20 is fed does not cause a delay in this case, so is substantially formed by a line. Delaying device 11 to which the byte with the position "1" of block 20 is fed is formed by a FIFO memory with $(D-1) \cdot 1/I$ bytes. The depth D of the interleaver 46 is normally chosen for VDSL systems in such a way that D−1 is a multiple of I. In general this expression indicates an average memory size, which may vary, for example, in that the FIFO memory is also used as an output buffer. The FIFO memory operates in such a way that a byte written into it is output again after write/read cycles of the FIFO memory corresponding to $(D-1) \cdot 1/I$. As—according to arrow A—the FIFO memory of delaying device 11 is described only by each Ith byte and, as will be described below, is also read out only in each Ith clock, there is a resulting delay by D−1 clocks for delaying device 11.

The delay increases from delaying device to delaying device, so the FIFO memory of delaying device 13, to which byte no. I−2 is fed, has a memory capacity of $(D-1) \cdot (I-2)/I$ bytes and that of delaying device 14 a memory capacity of $(D-1) \cdot (I-1)/I$ bytes.

The bytes output by delaying devices 10 to 14 are transmitted sequentially via the transmission line 6 from FIG. 4, as indicated in FIG. 5 by a double changeover switch 48. On the side of the receiver the de-interleaver 47 likewise comprises delaying devices, designated in FIG. 5 by reference numerals 15 to 19. Delaying device 15 comprises a FIFO memory comprising (D−1)·(I−1)/I bytes and delaying device 16 comprises a FIFO memory with (D−1)·(I−2)/I bytes, until finally delaying device 19 does not cause a delay. Delaying devices 15 to 19 are configured as complementary to delaying devices 10 to 14 of the interleaver 46. The incoming data are distributed over delaying devices 15 to 19 in such a way that the data delayed by delaying device 10 on the transmitter side are fed to delaying device 15 and the data output by delaying device 11 are fed to delaying device 16, etc., until finally the data output by delaying device 14 are fed to delaying device 19, in other words are not delayed. As indicated by an arrow C, delaying devices 15 to 19 are read out sequentially, in order to form a data block 33 with I bytes again.

Because of the complementary configuration of delaying devices 10 to 14 and 15 to 19 each byte in the interleaver and de-interleaver is delayed in total by (I−1)·(D−1) bytes, so that after the de-interleaver 47 the bytes are in the original sequence of data again.

A scale for the quality of the combination of coding for the purposes of error correction and interleaver is the so-called "error protection length", which indicates how many corrupted bytes in succession can be correctly restored. This depends on the one hand on the coding, in particular on the number of redundant bytes or data used, and also on the depth D of the interleaver.

In the set-up of a transmission connection a line quality is normally determined, for example by transmitting test data, and depending on this, on the one hand the transmission rate and on the other hand parameters of the above-described measures for avoiding transmission errors, in particular the code word length, the number of redundant bytes, the size of the block I and the interleaver depth D are set. These parameters must in this case be determined in such a way that on the one hand the necessary protection against byte errors and a required error protection length are achieved, but on the other hand a net data rate for the transmission is also maximised. The interleaver depth D is additionally limited by the available memory.

During transmission it is possible, though, that the type and strength of the source of the interferer may change. If interferences of the line become stronger this may lead to transmission errors. If interfering influences disappear, a possible achievable data rate is not utilised with the initially set parameters.

Conventionally, if sizeable bit errors have occurred over a specific period of time and they can no longer be corrected, the data transmission is completely stopped and then the connection is newly set up or the system reactivated, the above mentioned parameters of the coding and the interleaver being re-determined. By this measure the data transmission is interrupted for a relatively long time, which may be in the range of minutes. This interruption of the data transmission is very troublesome for many applications. Therefore regular adaptation to the current interference and associated optimisation of the transmission rate is not possible.

It is therefore desirable to be able to change at least part of the parameters mentioned during operation, without a noticeable interruption in the data transmission being associated with it.

SUMMARY

It is therefore an object of the invention to provide methods for enlarging or reducing a depth of an interleaver device and correspondingly also a de-interleaver device and also corresponding interleaver devices and de-interleaver devices, wherein their depth can be changed without substantial interruption of the data transmission.

This object is achieved by a method for enlarging a depth of an interleaver device according to embodiments of the invention, a method for reducing a depth of an interleaver device according to embodiments of the invention, a method for enlarging a depth of a de-interleaver device according to embodiments of the invention, a method for reducing a depth of a de-interleaver device according to embodiments of the invention and also an interleaver device and a de-interleaver device according to embodiments of the invention.

According to the invention, for enlarging a depth of an interleaver device for nesting data elements fed to the interleaver device, wherein the interleaver device comprises a delaying device for delaying the output of part of the data elements by a number of data elements depending on the depth, it is proposed to increase the delay and to output additional data elements to bridge a gap in the output of the data elements arising because of the increase. In particular the additional data elements can be arbitrary values.

The nesting can be done, in particular, in blocks, one block consisting of I data elements. In this case an allocated delaying device is preferably provided in the interleaver device for each data element of the block and the number of data elements by which a respective delaying device delays the output of a data element is dependent on the position of the data element in the block. In particular the delay can then be increased by (I−j)·I data elements, j being a position in the respective block of the data element which can be fed to the respective delaying device. In this way the depth can be enlarged in particular by a value I.

Additionally, a signal can be output, indicating a time at which the delay is increased, in order to inform an allocated de-interleaver device of the increase.

For corresponding reduction of the depth of the interleaver device a normal data transmission to the delaying device is interrupted for a specific number of data elements and additional data elements are passed to the interleaver device instead. However, data elements continue to be output from the interleaver device at the normal rate. The delay by which the delaying device delays the output of part of the data elements is in this case decreased.

Again a method of this kind can be applied, in particular to an interleaver in which, as already described, data are processed in blocks with a block length I and also I delaying devices are provided. I−j−1 additional data elements can here be fed to each delaying device, while the number of data elements by which a respective delaying device delays output is then shortened by j. In this case too a signal can be transmitted indicating at what point of the data elements the additional data are inserted.

The depth of a corresponding de-interleaver can also be enlarged or decreased corresponding to the above-illustrated method for enlarging or reducing the depth of an interleaver.

The transmitted additional data elements are in particular rejected or, if the depth of the de-interleaver is reduced, deleted.

Data elements can be in particular individual bytes, but it is also possible for the data elements to be formed by two or more bytes or else only individual bits. Enlarging or reducing the depth can be done depending on an interference level of a transmission line.

The delaying devices can be formed in particular by FIFO memories or buffers. FIFO memories of this kind may be varied by the use of pointers characterising an area of a write/read memory assigned to a respective FIFO memory. Reducing the number of data elements by which the delaying device delays the output of a data element then corresponds to shortening or decreasing the respective FIFO memory. The memory space becoming free can be used for other applications.

The invention additionally provides interleavers or de-interleavers, the depth of which can be changed by means of the described methods. In a transceiver an interleaver according to the invention can be arranged in a transmit path and a de-interleaver according to the invention in a receive path.

By means of the invention a simple change in the depth of an interleaver or a de-interleaver in a transmitting or receiving device is possible, without interrupting the data transmission simply by transmitting a small number of additional data elements containing no information. It is possible to dispense with transmitting the additional data elements, in this case additional data elements being inserted in the receiving device, in order to replace the additional data elements (which have not been transmitted).

The invention is explained in greater detail below using preferred embodiment examples with reference to the attached drawings.

BRIEF DESCRIPTION OF THE DRAWINGS

FIG. 1 shows a block diagram of a transmitting and a receiving device with interleaver and de-interleaver according to the invention.

FIG. 2 shows a schematic illustration of the methods according to the invention for increasing a depth of an interleaver or de-interleaver.

DETAILED DESCRIPTION

Figure 4:
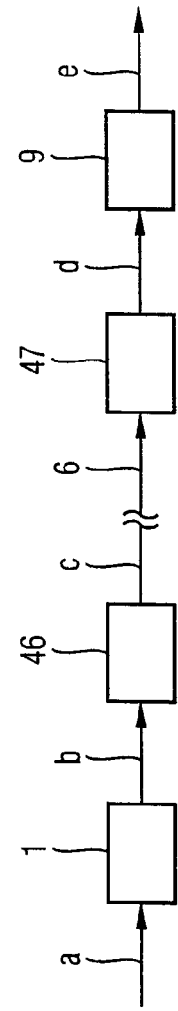
FIG. 4 shows a schematic diagram of a conventional transmitting device and a conventional receiving device.

In FIG. 1 a transmitting device 5 with an interleaver 2 according to the invention and a receiving device 7 with a de-interleaver 8 according to the invention are schematically illustrated. Elements corresponding to those in FIG. 4 already described in the introduction to the description have the same reference numerals as in FIG. 4.

A signal a to be transmitted is fed to the transmitting device 5. This signal a is coded by a coder 1, in order to obtain a coded signal b. The coder 1 may, for example, in the case of ADSL or VDSL signals, carry out a Reed Solomon coding or else some other coding for error correction, as already explained in the introduction to the description. The coded signal b is fed to an interleaver 2, which nests or encrypts the data elements contained in the signal b, in order to distribute data elements of a so-called code word, i.e. a coded block of data elements, over a larger period of time, gaps arising being filled by data elements of other code words.

The thus arising signal c is transmitted via a transmission line 6 and on the side of the receiving device 7 processed by a de-interleaver 8 in such a way that the encryption or nesting of the interleaver 2 is undone, so that a signal d is generated, substantially corresponding to the coded signal b. Any transmission errors contained in the signal d, for example bit errors, are corrected by a decoder 9. Simultaneously the coded signal d is decoded, so that a signal e output by the decoder 9 corresponds to the signal a to be transmitted if complete correction of occurring errors has been possible.

The interleaver 2 and the de-interleaver 8 in each case have a specific depth, substantially indicating over how many blocks or code words of the coded signal b the nesting of the data elements extends. According to the invention this depth can be varied while the transmitting or receiving operation is in progress. For this a control device 3 can be provided, which evaluates information about a quality of the line, i.e. about occurring interference. The control unit 3 can either acquire these interferences, as indicated by a dotted arrow 4, from measurements on the transmission line 6 or obtain them from the decoder 9, which reports a number of errors to be corrected. If this number is very small, this signifies good line quality, so the depth can be reduced if necessary. On the other hand, in this case both a transmission rate and the depth can be increased, in order to achieve nesting over a constant period of time at an increased transmission rate. In reverse, a high number of transmission errors or one which can no longer be corrected at all signify poor line quality with strong interferers, so the depth should be increased, in order, as explained in the introduction to the description, to guarantee better transmission quality or a higher error correction length. In the case of a multiplicity of weak interferers it may, on the other hand, be advantageous to reduce the depth, so that individual blocks are transmitted over a shorter period of time and thus disturbed by fewer interferers. For this the control unit 3 transmits to the interleaver 2 a control signal f, which causes it to change its depth. Simultaneously a signal can be transmitted to the de-interleaver 8 from the interleaver 2 or the control unit 3 via the transmission line 6, which likewise causes it to change its depth.

If necessary, the control unit 3 may also transmit a further control signal g which occasions a data rate of the transmitting signal a to be increased if the quality of the line 6 allows it.

As also already described earlier in FIG. 4, in the transmitting device 5 and in the receiving device 7 of FIG. 1 only those elements required for understanding the present invention are illustrated. Naturally, in an actual transmitting or receiving device there is a multiplicity of further elements, such as transmitting amplifiers, various filters, digital-to-analog or analog-to-digital converters or devices for modulation or demodulation of the signal to be transmitted. The exact configuration of these elements is, however, not essential for the present invention.

Figure 5:
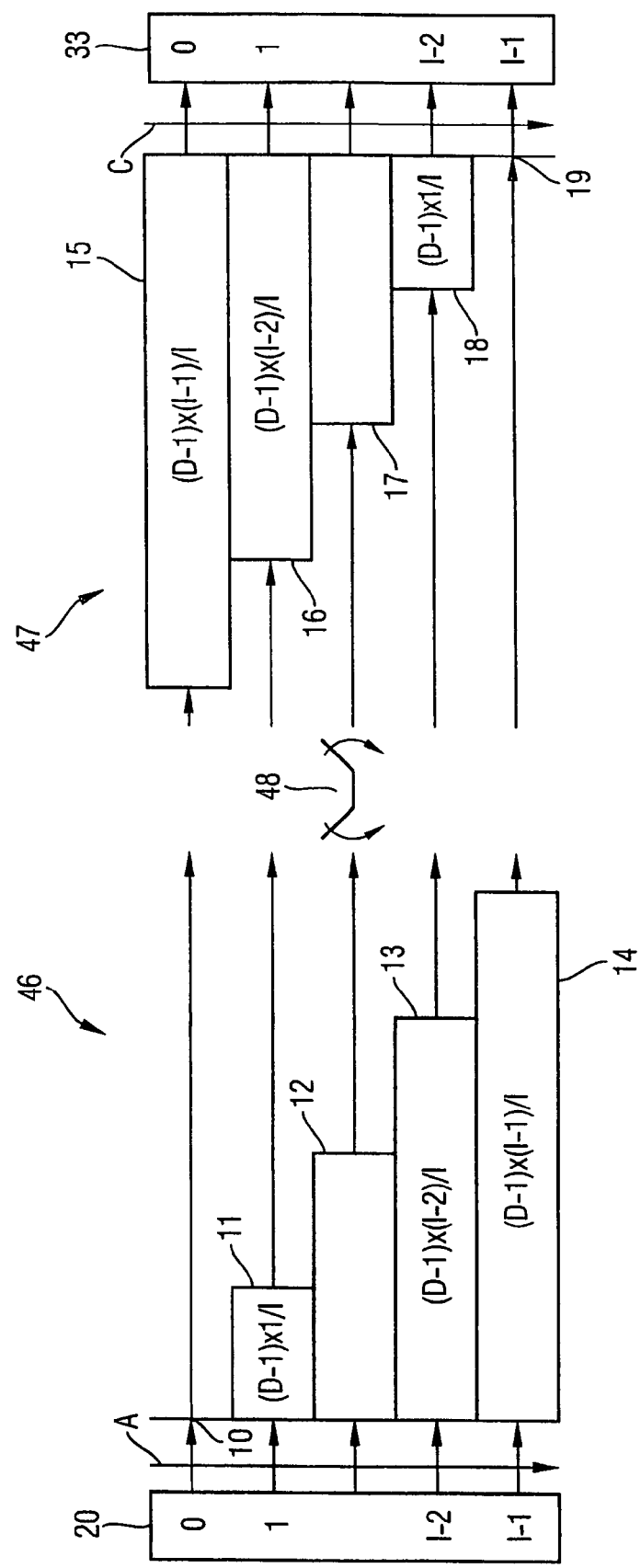
FIG. 5 shows a schematic illustration of the mode of operation of an interleaver and a de-interleaver.

The interleaver 2 according to the invention may be, in particular, an interleaver operating on the principle of a convolutional interleaver, as already initially described in the introduction to the description with reference to FIG. 5. Hereinafter a method for increasing the depth of the interleaver 2 and a corresponding de-interleaver 8 will now be explained with reference to FIG. 2.

The schematic illustration of the interleaver 2 or the de-interleaver 8 shown in FIG. 2 corresponds to the illustration of the corresponding elements of FIG. 5, identical elements again having the same reference numerals.

Data in the form of blocks 20 with I bytes, here having the indices or numbers 0 to I−1, are fed to the interleaver 2 according to the invention as to the interleaver already described with reference to FIG. 5. These bytes are fed sequentially, as indicated by an arrow A in FIG. 2, to delaying devices 10 to 14, configured as FIFO memories (First In First Out). Delaying device 10 is in this case not a delaying device in the proper sense, as no delay takes place here. Byte no. 0 of block 20 is fed to this delaying device 10.

Delaying device 11 has a FIFO memory with (D−1)·1/I memory cells and byte no. 1 of block 20 is fed to it. D designates the so-called depth of the interleaver. For VDSL systems D−1 is normally a multiple of I. These and following details relating to memory size are in general average values, as the actual size may vary minimally, in particular if the FIFO memories simultaneously act as buffers for converting the continuous data stream a into the data c transmitted in blocks or vice versa. As only every Ith byte, namely byte no. 1 of each data block 20, is fed to this delay element and it is also read out only in every Ith clock, an overall delay of D−1 bytes or clocks results during output.

In general each byte of block 20 is fed to an allocated delaying device of delaying devices 10 to 14, which has a FIFO memory of length (D−1)·j/I bytes, j being the number of the respective byte of block 20.

The delay elements are read out sequentially, as indicated by an arrow B, and the data thus generated by the interleaver 2 are transmitted to a receiver via the transmission line 6 from FIG. 1. By using the delay elements, successive blocks 20 are nested with one another, i.e. bytes of different blocks directly follow one another during transmission.

In the de-interleaver 8 on the receiver side the incoming data are again distributed sequentially over delaying devices 15 to 19, corresponding to arrow B, the transmission being synchronised in such a way that bytes output by delaying device 10 are fed to delaying device 15 and bytes output by delaying device 11 to delaying device 16, etc., until finally bytes output by delaying device 14 are fed to delaying device 19, which—similarly to delaying device 10—is not a delaying device in the proper sense, as it does not delay the incoming data. Delaying devices 15 to 18 are again configured as FIFO memories, which in this case have a length of (D−1)·(I−1−j)/I bytes, j being the number of the byte of block 20 fed to the respective delaying device 15 to 19. In this way it is achieved that each byte of block 20 is delayed in the interleaver 2 and the de-interleaver 8 in total by (D−1)·(I−1) bytes or clocks, so that at the output of the de-interleaver 8, at which delaying devices 15 to 19 are read out sequentially, corresponding to an arrow C, the original sequence of bytes is restored, so an output block 33 corresponds to block 20.

If it emerges during the data transmission that interferences in the transmission line 6 have enlarged and therefore a greater interleaver depth D would be desirable, the depth of the interleaver 2 can be enlarged by the value I by the method described below.

Firstly, at a certain time all the FIFO memories of delaying devices 11 to 14 are lengthened in the interleaver by a specific number of bytes in each case in that these bytes are attached to the beginning of the respective FIFO memory. The number corresponds to the number of the byte in block 20 to be fed to the respective delaying device 11 to 14. This means that the FIFO memory of delaying device 11 is lengthened by one byte, as indicated by block 21, the FIFO memory of delaying device 12 is lengthened by block 22, the FIFO memory of delaying device 13 is lengthened by I−2 bytes of a block 23, until finally the FIFO memory of delaying device 14 is lengthened by I−1 bytes by a block 24. The first "delaying device" 10 remains unchanged. The added FIFO memory blocks 21 to 24 may contain arbitrary values. They may be random or FIFO memory blocks 21 to 24 may be initialised by an arbitrary value, for example zero.

The various FIFO memories may, for example, be implemented in a single memory, for example a memory with optional access (RAM, Random Access Memory), pointers marking the beginning and end of the various FIFO memories. Adding FIFO memory blocks 21 to 24 can then be done in a simple manner by moving the appropriate pointers.

The time or the point in the data stream of the coded signal b from FIG. 1, at which this lengthening of the FIFO memories takes place, is communicated to the receiver 7, in particular to the de-interleaver 8 or agreed with it. The exact definition of this time at which the insertion takes place is important. This is normally done via a communication channel. A communication channel of this kind is present in any case, as various transmitters and receivers in transmission systems have to exchange administrative information in any case. The time at which the insertion of FIFO memory blocks 21 to 24 takes place may be defined depending on a specific synchronisation time, set by a frame signal transmitted regularly but rarely, or a special synchronisation signal may be transmitted. It is also possible to insert an appropriate definition into so-called headers of data blocks.

As soon as (D−1)·(I−1) bytes have been transmitted to the receiver 7 after insertion of FIFO memory blocks 21 to 24, i.e. after (D−1)·(I−1) clocks, the FIFO memories of delaying devices 15 to 18 are lengthened at their outputs in the de-interleaver 8, which can be done in the same way as the insertion of FIFO memory blocks 21 to 24 at the inputs of the FIFO memories of delaying devices 11 to 14 by moving pointers, for example. In delaying device 15 a FIFO memory block 25 with I−1 byte is attached, in delaying device 16 a FIFO memory block of I−2 bytes in length, etc., until finally in delaying device 18 a FIFO memory block 28 with one byte length is attached. In total the length of FIFO memory blocks 25 to 28 amounts to I−1−j in each case, j again being the number of the corresponding byte in block 33. The bytes of these attached FIFO memory blocks 25 to 28, like those of FIFO memory blocks 21 to 24, can adopt arbitrary values in the interleaver 2.

The effect of the above-illustrated timing is that a total of I−1 bytes with arbitrary values is applied to the end of each FIFO memory and also to "delaying device" 19 after FIFO memory blocks 25 to 28 have been attached. These bytes are rejected, as, as indicated by blocks 29 to 32 in FIG. 2, at this time those bytes which were added in the interleaver 2 by adding FIFO memory blocks 21 to 24 are at the end of delaying devices 15 to 19.

Normal transmit/receive operation can then be immediately continued. Therefore non-usable bytes are read out only for 1·(I−1) clocks, which in normal operation is unlikely to lead to a noticeable delay in the data transmission.

It should be noted that the arbitrary values inserted into the interleaver 2 on enlargement of the memories do not have to be transmitted. As the time at which these values would have been transmitted is known to the de-interleaver 8, it can insert arbitrary values at an appropriate point, without them actually having to be transmitted. If appropriate buffers are provided or the FIFO memories of the de-interleaver are appropriately adapted, user data can be transmitted without interruption.

Additionally, inserting the additional FIFO memory blocks in the interleaver and de-interleaver can also take place in such a way that all the FIFO memories are lengthened by I−1 bytes and then shortened again at a suitable time depending on the respective memory, for example "memory" 10 by the full I−1 bytes.

Figure 3:
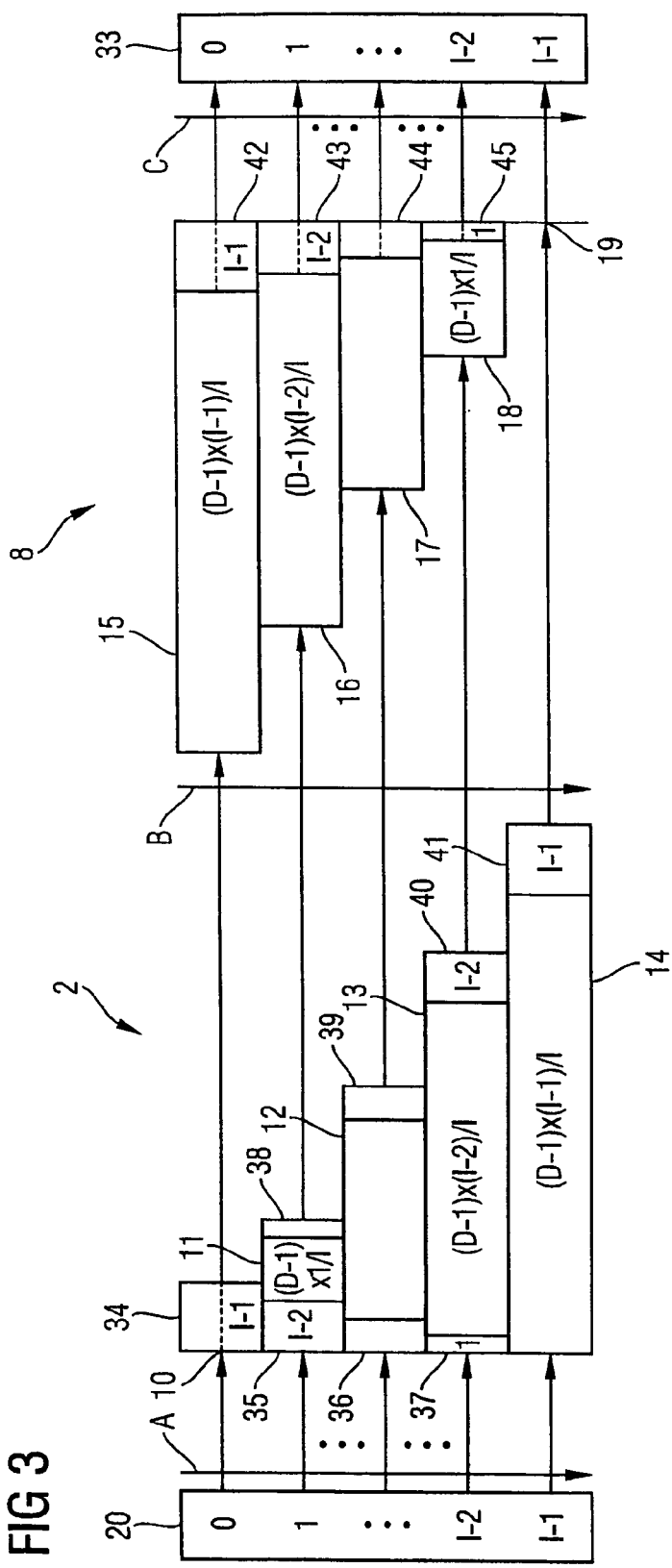
FIG. 3 shows a schematic illustration of the methods for reducing a depth of an interleaver and a de-interleaver.

In FIG. 3, using the same interleaver 2 and de-interleaver 8 as in FIG. 2, a method according to the invention is illustrated whereby the interleaver/de-interleaver depth D can be reduced by the value I. This method is applied, for example, if it is established that, owing to a change in the transmission quality via transmission line 6, a reduction in the interleaver or de-interleaver depth is possible.

For this the normal data transmission of the coded signal b shown in FIG. 1 to the interleaver 2 is interrupted for 1·(I−1) bytes at an arbitrary time and instead of the normal transmission data so-called dummy bytes are transmitted, i.e. bytes with arbitrary content. This transmission is executed in such a way that I−1 dummy bytes of this kind are transmitted to the first delaying device 10, I−2 dummy bytes to delaying device 11, etc., until only 1 dummy byte is transmitted to delaying device 13 and no further dummy bytes to delaying device 14. These dummy bytes are characterised by blocks 34 to 37 in FIG. 3. The allocation of the dummy bytes to delaying devices 10 to 14 therefore does not take place in the "normal" sequential rhythm according to arrow A.

During this time, however, delaying devices 10 to 14 continue to be read out sequentially as usual according to arrow B and the corresponding data are transmitted. This means that the FIFO memories of delaying devices 11 to 14 are evenly emptied, whereby, for example, the FIFO memory of delaying device 14 is or can be shortened by I−1 bytes, as during this time no data elements or bytes are fed to delaying device 14, but I−1 bytes are read out. Correspondingly the FIFO memory of delaying device 13 is shortened by I−2 bytes, as indicated by block 40. The FIFO memory of delaying device 11 is shortened by only one byte, as indicated by block 38. In total therefore delaying devices 11 to 14 are shortened by the bytes indicated by blocks 38 to 41, the number of bytes corresponding to the index j of the respective bytes of block 20.

As also in the method described with reference to FIG. 2 for increasing the depth of the interleaver 2 and the de-interleaver 8, here too a signal is transmitted to the receiver 7 and in particular to the de-interleaver 8, which communicates to the de-interleaver 8 at what point of the data stream the dummy bytes are inserted and that the depth should be decreased by the value I. As soon as (D−1)·(I−1) bytes have been transmitted after the beginning of inserting the dummy bytes, the FIFO memories of delay elements 15 to 18 are shortened at their outputs in the de-interleaver 8. The FIFO memory of delaying device 15 is in this case shortened by I−1 bytes, as indicated by block 42, the FIFO memory of delaying device 16 is shortened by I−2 bytes according to block 43, etc. until finally the FIFO memory of delaying device 18 is shortened by only 1 byte corresponding to block 45. Block 44 indicates the shortening of the FIFO memory of delaying device 17.

These bytes deleted by the shortenings correspond exactly to the dummy bytes inserted in the interleaver 2, so exactly those bytes containing no information in any case are deleted or rejected. According to this method there is an interleaver 2 and a de-interleaver 8, the depth D of which has been decreased by I.

Here too no user data can be transmitted for only I(I−1) bytes and the reduction in the depth of the interleaver 2 and the de-interleaver 8 takes place while operation is in progress.

For continuous data transmission it is additionally possible, as described for the enlargement of the depth, to dispense with actual data transmission of the dummy bytes.

Naturally, the method illustrated can also be applied in other types of interleavers and de-interleavers which use delaying devices for nesting data. The data can also be nested, for example, in data elements with several bytes or only a few bits, instead of in bytes. Only the timing and the length by which the delay elements are changed must be appropriately adapted.

The present invention is particularly suitable for ADSL and VDSL transmission systems. In a combined transmitting/receiving device the appropriate method according to the invention is then applied both in the transmitting part for the interleaver and in a receiving part for a de-interleaver.

The invention claimed is:

1. An interleaver device for nesting data elements, comprising:
    at least one delaying device configured to delay an output of data elements, the interleaver device being configured in such a way that part of the data elements provided to the interleaver device are provided to the at least one delaying device,
    a first unit configured to change the delay of the at least one delaying device,
    a source of additional data elements, the source coupled to provide the additional data elements to the at least one delaying device;
    wherein the interleaver device is configured such that the source of additional data elements inserts data elements between a last data element received by the at least one delaying device before the increase in the delay and the first data element received by the at least one delaying device after a change in the delay increasing the delay, such that the interleaver device provides substantially continuous output of the data elements.

2. The device of claim 1, wherein the first unit is configured to change the delay based on a signal received by the interleaver, the signal indicating a delay time.

3. The device of claim 1, wherein the interleaver comprises a convolutional interleaver.

4. The device of claim 1, wherein the at least one delaying device comprises a plurality of delaying devices; and
    wherein the data elements are divided into blocks, a number of data elements in each of the blocks corresponding to a number of delaying devices; and
    wherein the number of data elements by which a delay in one of the delaying devices is increased depends on a position of the corresponding data element in the block 5. The device of claim 4, wherein each of the delaying devices causes a delay of (D−1)·j data elements, D representing the depth of the interleaver device and j representing the position in the block of the data element, and
    the number of data elements by which the delay in the respective delaying device is increased amounts to I−j, where I is the number of data elements in a block.

6. The device of claim 1, wherein the at least one delaying device comprises a memory with a first number of memory cells configured to store data elements; and
    wherein a number of memory cells configured to store data elements are added to at least some memories in order to increase the delay.

7. The device of claim 6, wherein the number or memory cells are added to a beginning of each of the at least some memories in order to increase the delay.

8. The device of claim 7 wherein the number of memory cells allocated to each of the memories is an average number which is variable in operation of the interleaver device.

9. An interleaver device for nesting data elements, comprising:

at least one delaying device configured to delay an output of data elements, the interleaver device being configured in such that part of the data elements provided to the interleaver device are provided to the at least one delaying device, a first unit configured to change the delay of the at least one delaying device, a source of additional data elements, the source coupled to provide the additional data elements to the at least one delaying device;

wherein the interleaver device is configured such that the source of additional data elements inserts data elements in such a way that differences between a part of the data elements provided to the at least one delaying device and remaining data elements caused by a decrease in the delay are balanced out.

10. The device of claim 9, wherein the interleaver is a convolutional interleaver.

11. The device of claim 10, wherein a number of additional data elements are inserted into each of the delaying devices depending on a position in the block of the data element provided to the respective delaying device.

12. The device of claim 9, wherein the at least one delaying device comprises a plurality of delaying devices;

wherein the data elements are divided into blocks, a number of data elements in each of the blocks corresponding to a number of delaying devices; and wherein the number of data elements by which a delay in one of the delaying devices is decreased depends on a position of the corresponding data element in die block.

13. The device of claim 12, wherein each of the delaying devices provides a delay of (D−1)·j data elements before the delay is decreased, D representing the depth of the interleaver device and j representing the position in the block of the data element fed to the respective delaying device, and the number of data elements by which the delay in the respective delaying device is decreased amounts to I−j, where I is the number of data elements in a block.

14. The device of claim 9, wherein the at least one delaying device comprises a memory with a first number of memory cells configured to store data elements; and wherein a number of memory cells configured to store data elements is decreased in at least some memories in order to increase the delay.

15. The device of claim 14, wherein the interleaver device comprises a main memory in which the memory cells of the memories are fixed by pointers.

16. The device of claim 15, wherein, in order to decrease the delay, the memory cells configured to store data elements at one end of each of the at least some memories is decreased.

17. The device of claim 16, wherein the number of memory cells allocated to each of the memories is an average number which is variable in operation of die interleaver device.

18. A de-interleaver device for de-interleaving data elements carried out by a corresponding interleaver device, the de-interleaver device comprising:

a delaying device configured to delay an output of data elements provided thereto within the de-interleaver device, the de-interleaver device being configured to provide part of the data elements to the delaying device;

a unit configured to change the delay of the delaying device; and a source of additional data elements operable to provide as output additional data elements between the last data element output from the delaying device before an increase in the delay and the first data element provided to the delaying device after the increase in the delay in such a way tat a correct sequence of the data elements output from the de-interleaver device is retained.

19. The de-interleaver device according to claim 18, wherein the delaying device is further operable to delaying the output of data elements intended to be transmitted as a DSL signal.

20. The device of claim 18, wherein the delay is increased as a function of a received signal, the received signal identifying a time at which the delay is to be increased in the corresponding inrerleaver device.

21. The device of claim 18, wherein the de-interleaver comprises a convolutional de-interleaver.

22. The device of claim 18, wherein the at least one delaying device comprises a plurality of delaying devices;

wherein the data elements are divided into blocks, a number of data elements in each of the blocks corresponding to a number of delaying devices; and wherein the number of data elements by which a delay in one of the delaying devices is increased depends on a position of the corresponding data element in the block.

23. The device of claim 22, wherein each of the delaying devices has a delay which together with a delay of the respective data element in the corresponding interleaver device results in a constant delay value irrespective of a position of the data element in the block that is provided to the delaying device.

24. The device of claim 23, wherein each of the delaying devices causes a delay of (D−1)·(I−j−1) data elements before the delay is increased, D representing the depth of the de-interleaver device and j representing a position in the block of the data element provided to the respective delaying device, I representing a number of data elements in each block, and wherein an increase in delay corresponds to (I−i−1) data elements.

25. The device of claim 18, wherein the at least one delaying device comprises a memory with a first number of memory cells configured to store data elements, and wherein the delay is increased by adding a number of memory cells configured to store data elements to at least some memories in order to increase the delay.

26. A de-interleaver device for de-interleaving data elements carried out by a corresponding interleaver device, the de-interleaver device comprising:

a delaying device configured to delay an output of data elements provided to the delaying device from the de-interleaver by a number of data elements depending on a depth of the delaying device; and a unit configured to reduce the delay of the output by deleting additional data elements inserted between the last data element output from the delaying device before a decrease in the delay and the first data element provided to the delaying device after the decrease in the delay in such a way that a correct sequence of the data elements output from the de-interleaver device is retained.

27. The device of claim 26, wherein a reduction in the delay is a function of a received signal identifying a time at which the delay is to be increased in the corresponding interleaver device.

28. The device of claim 26, wherein the de-interleaver comprises a convolutional de-interleaver.

29. The device of claim 26, wherein the at least one delaying device comprises a plurality of delaying devices;

wherein the data elements are divided into blocks, a number of data elements in each of the blocks corresponding to a number of delaying devices; and wherein the number of data elements by which a delay in one of the delaying devices is reduced depends on a position of the corresponding data element in the block.

30. The device of claim 29, wherein each of the delaying devices causes a delay of (D−1)·(I−j−1) data elements before the delay is reduced, D representing the depth of the de-interleaver device and j representing a position in the block of the data element provided to the respective delaying device, I representing a number of data elements in each block, and wherein a reduction in the delay amounts to I·(I−j−1) data elements.

31. The device of claim 26, wherein the at least one delaying device comprises a memory with a first number of memory cells configured to store data elements, and wherein the delay is decreased by decreasing a number of memory cells configured to store data elements in at least some memories.

32. The device of claim 6, wherein the interleaver device comprises a main memory in which the memory cells of the memories are fixed by pointers.

* * * * *

UNITED STATES PATENT AND TRADEMARK OFFICE
CERTIFICATE OF CORRECTION

PATENT NO. : 7,549,093 B2  
APPLICATION NO. : 11/137103  
DATED : June 16, 2009  
INVENTOR(S) : Bernd Heise Page 1 of 1

It is certified that error appears in the above-identified patent and that said Letters Patent is hereby corrected as shown below:

On the Title page of the Patent:
(Between (22) and (65)): insert
--(30) Foreign Application Priority Data May 24, 2004 (DE)...........................102004025405.2
Jun. 2, 2004 (DE)...........................102004026800.2--

In the Claims:
(Column 10, line 53): replace "I-j" with --I·j--
(Column 11, line 37): replace "I-j" with --I·j--
(Column 12, line 33): replace "(I-i-1)" with --I·(I-j-1)--

Signed and Sealed this

Seventeenth Day of November, 2009

David J. Kappos
*Director of the United States Patent and Trademark Office*